(12) United States Patent
Matsumoto et al.

(10) Patent No.: US 10,874,038 B2
(45) Date of Patent: *Dec. 22, 2020

(54) COMPONENT SUPPLY DEVICE

(71) Applicant: FUJI CORPORATION, Chiryu (JP)

(72) Inventors: Toru Matsumoto, Okazaki (JP); Shunji Morikawa, Toyoake (JP)

(73) Assignee: FUJI CORPORATION, Chiryu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/929,120

(22) Filed: Apr. 5, 2019

(65) Prior Publication Data

US 2019/0239399 A1     Aug. 1, 2019

Related U.S. Application Data

(63) Continuation of application No. 15/558,431, filed as application No. PCT/JP2015/057993 on Mar. 18, 2015, now Pat. No. 10,314,217.

(51) Int. Cl.
*H05K 13/00* (2006.01)
*H05K 13/02* (2006.01)
(Continued)

(52) U.S. Cl.
CPC ....... *H05K 13/0015* (2013.01); *H05K 13/022* (2013.01); *H05K 13/028* (2013.01); *H05K 13/043* (2013.01); *H05K 13/081* (2018.08)

(58) Field of Classification Search
CPC ............. H05K 13/0015; H05K 13/043; H05K 13/022; H05K 13/028; H05K 13/081; H05K 13/02
See application file for complete search history.

(56) References Cited

U.S. PATENT DOCUMENTS 6,056,108 A    5/2000    Buchi et al.
8,953,034 B1    2/2015    Milosevic
(Continued)

FOREIGN PATENT DOCUMENTS

CN        1969296 A    5/2007
CN     101129107 A    2/2008
(Continued)

OTHER PUBLICATIONS

International Search Report dated May 26, 2015, in PCT/JP2015/057993 filed Mar. 18, 2015.
(Continued)

*Primary Examiner* — John B Strege
(74) *Attorney, Agent, or Firm* — Oblon, McClelland, Maier & Neustadt, L.L.P.

(57) ABSTRACT

A component supply device that images stage on which multiple leaded components are supported in a scattered state, and holds a component supported on the stage using a component holding tool based on the image data, wherein multiple stages of different colors are prepared, and a stage from among the multiple stages a stage with a color different to a component that is planned to be supplied is removably attached to component support member. By this, for example, in a case in which a component planned to be supplied is white, by attaching a black stage to the component support section, due to the contrast between the background and the target object, it is possible to clearly recognize the white component supported on the black stage.

10 Claims, 13 Drawing Sheets

(51) Int. Cl.
*H05K 13/04* (2006.01)
*H05K 13/08* (2006.01)

(56) References Cited

U.S. PATENT DOCUMENTS

| | | |
|---|---|---|
| 2004/0193331 A1 | 9/2004 | Kashiwada |
| 2007/0293969 A1 | 12/2007 | Hirai et al. |
| 2008/0037890 A1 | 2/2008 | Tanabe et al. |
| 2011/0025840 A1 | 2/2011 | Fiegler |
| 2013/0222824 A1 | 8/2013 | Kishi |
| 2014/0201126 A1 | 7/2014 | Zadeh |
| 2015/0062332 A1 | 3/2015 | Lee |
| 2015/0166273 A1 | 6/2015 | Price |
| 2016/0001980 A1 | 1/2016 | Bott |

FOREIGN PATENT DOCUMENTS

| | | |
|---|---|---|
| JP | 6-127698 A | 5/1994 |
| JP | 8-323669 A | 12/1996 |
| JP | 10-202569 A | 8/1998 |
| JP | H11150132 A | 6/1999 |
| JP | 11-80538 A | 7/1999 |
| JP | 2005-183573 A | 7/2006 |
| JP | 2008-190912 A | 8/2008 |
| JP | 2009070976 A | 4/2009 |
| JP | 2010-147396 A | 7/2010 |
| JP | 2013-253913 A | 12/2013 |
| JP | 2013251322 A | 12/2013 |
| WO | WO2016/030946 A1 | 3/2016 |

OTHER PUBLICATIONS

Extended European Search Report dated Dec. 21, 2017 in Patent Application No. 15885427.3, 7 pages.

COMPONENT SUPPLY DEVICE

CROSS REFERENCE TO RELATED APPLICATIONS

This application is a continuation of U.S. application Ser. No. 15/558,431, filed Sep. 14, 2017, which is a national stage application of International Application No. PCT/JP2015/057993, filed Mar. 18, 2015; the entire contents of each of the above are incorporated herein by reference.

TECHNICAL FIELD

The present application relates to a component supply device that supplies components from a stage on which multiple components are supported in a scattered state.

BACKGROUND ART

There is a known component supply device that images a stage on which are supported multiple components in a scattered state, and, based on the image data, holds a component supported on the stage using a component holding tool. With a component supply device configured as such, to appropriately hold a component on the stage, it is necessary to acquire information related a position, orientation, and the like of a component on the stage based on the image data. An example of a processing method of the image data is disclosed in the below patent literature.
Patent Literature 1: JP-A-2013-253913

SUMMARY

Technical Problem

According to technology disclosed in the above patent literature, it is possible to a certain extent to acquire information related a position, orientation, and the like of a component on the stage based on the image data. However, it is desirable to acquire information related a position, orientation, and the like of a component on the stage with greater accuracy. The present disclosure takes account of such circumstances, and an object thereof is to acquire information related a position, orientation, and the like of a component on the stage with greater accuracy.

Solution to Problem

To solve the above problems, a component supply device of the present disclosure includes: a component support section including a stage configured to support multiple components in a scattered state; an imaging device configured to image a component supported on the stage; and a component holding tool configured to hold the component supported on the stage, based on the image data imaged by the imaging device; wherein multiple types of the stage are prepared, and a given stage out of the multiple types of the stages is removably attached to the component support section.

Advantageous Effects

With a component supply device of the present disclosure, multiple types of the stage are prepared, and a given stage out of the multiple types of the stages is removably attached to the component support section. Thus, for example, it is possible to attach a stage with a different color to the color of a component planned to be supplied to the component support section. Specifically, for example, in a case in which a component planned to be supplied is white, by attaching a black stage to the component support section, due to the contrast between the background and the target object, it is possible to clearly recognize the white component supported on the black stage. By this, it is possible to acquire with good accuracy information related to a position, orientation, and the like of a component on the stage based on the image data. Also, for example, when a cylindrical component is being supplied, if the cylindrical component is scattered on a flat stage, the component may roll on the stage, making it impossible to acquire appropriate imaging data. In such a case, for example, by attaching a stage formed with a groove to the component support section, it is possible for the cylindrical component to sit in the groove, thereby preventing rolling of the component. By this, it is possible appropriately image the component on the stage and to acquire with good accuracy information related to a position, orientation, and the like of a component on the stage based on the image data.

DESCRIPTION OF PREFERRED EMBODIMENTS

Figure 1:
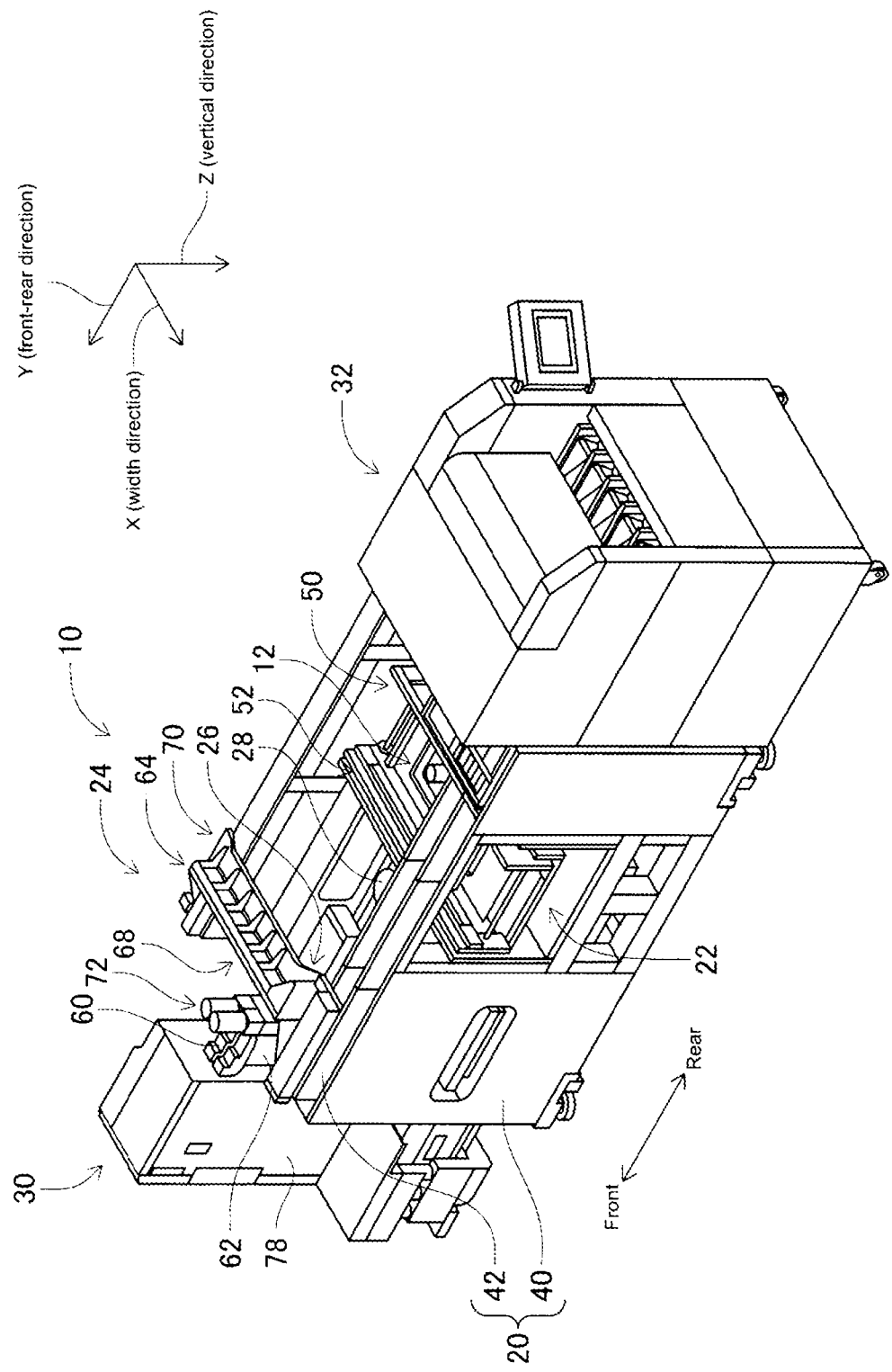
FIG. 1 is a perspective view of a component mounter.

The following describes in detail referring to the figures an example embodiment of the present disclosure.
Configuration of Component Mounter
FIG. 1 shows component mounter 10. Component mounter 10 performs work of mounting components on circuit board 12. Component mounter 10 is provided with device main body 20, board conveying and holding device 22, component mounting device 24, imaging devices 26 and 28, component supply device 30, loose component supply device 32, and control device (refer to FIG. 8) 34. Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
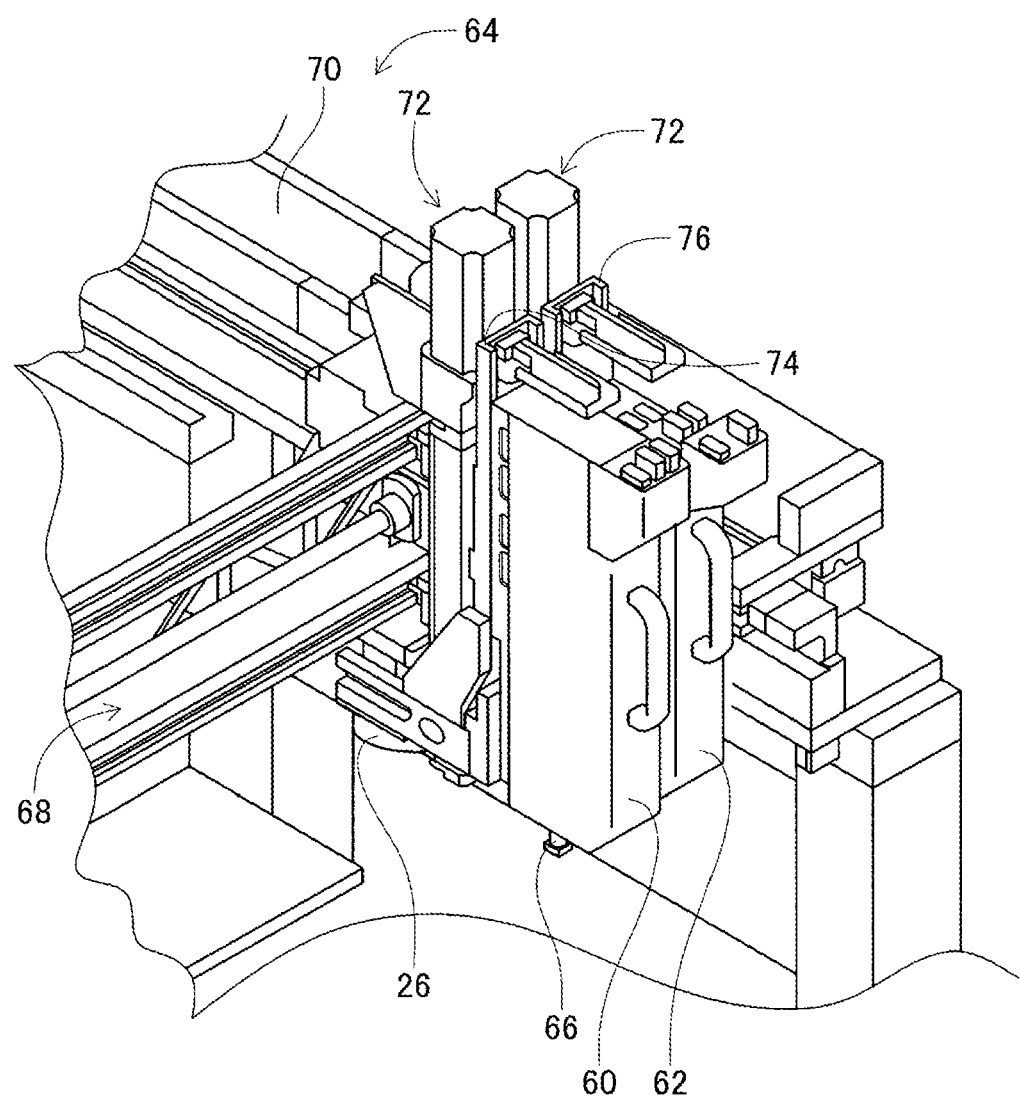
FIG. 2 is a perspective view of a component mounting device of the component mounter.

Component mounting device 24 is provided on beam section 42, and includes work heads 60 and 62 and work head moving device 64. Each work head 60 and 62 includes suction nozzle 66 (refer to FIG. 2) and holds a component using suction nozzle 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, as shown in FIG. 2, work head 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Imaging device 26 is attached to slide 74 in a state facing downwards, and is moved in the X direction, Y direction, and Z direction together with work head 60. Thus, imaging device 26 images any position on frame section 40. As shown in FIG. 1, imaging device 28 is provided in a state facing upwards on frame section 40 between board conveying and holding device 22 and component supply device 30. By this, imaging device 28 images a component held by suction nozzle 66 of work heads 60 and 62.

Component supply device 30 is provided at an end of frame section 40 in the front-rear direction. Component supply device 30 includes tray-type component supply device 78 and feeder-type component supply device (not shown). Tray-type component supply device 78 supplies components in a state arranged in a tray. The feeder-type component supply device supplies components via a tape feeder (not shown) or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. The configuration of component supply device 32 is described below in detail. Note that, components supplied by component supply device 30 and loose component supply device 32 may include electronic circuit components, configuration components of solar panels, configuration components of power modules, and the like. Also, electronic circuit components include components with leads and components without leads.

Figure 3:
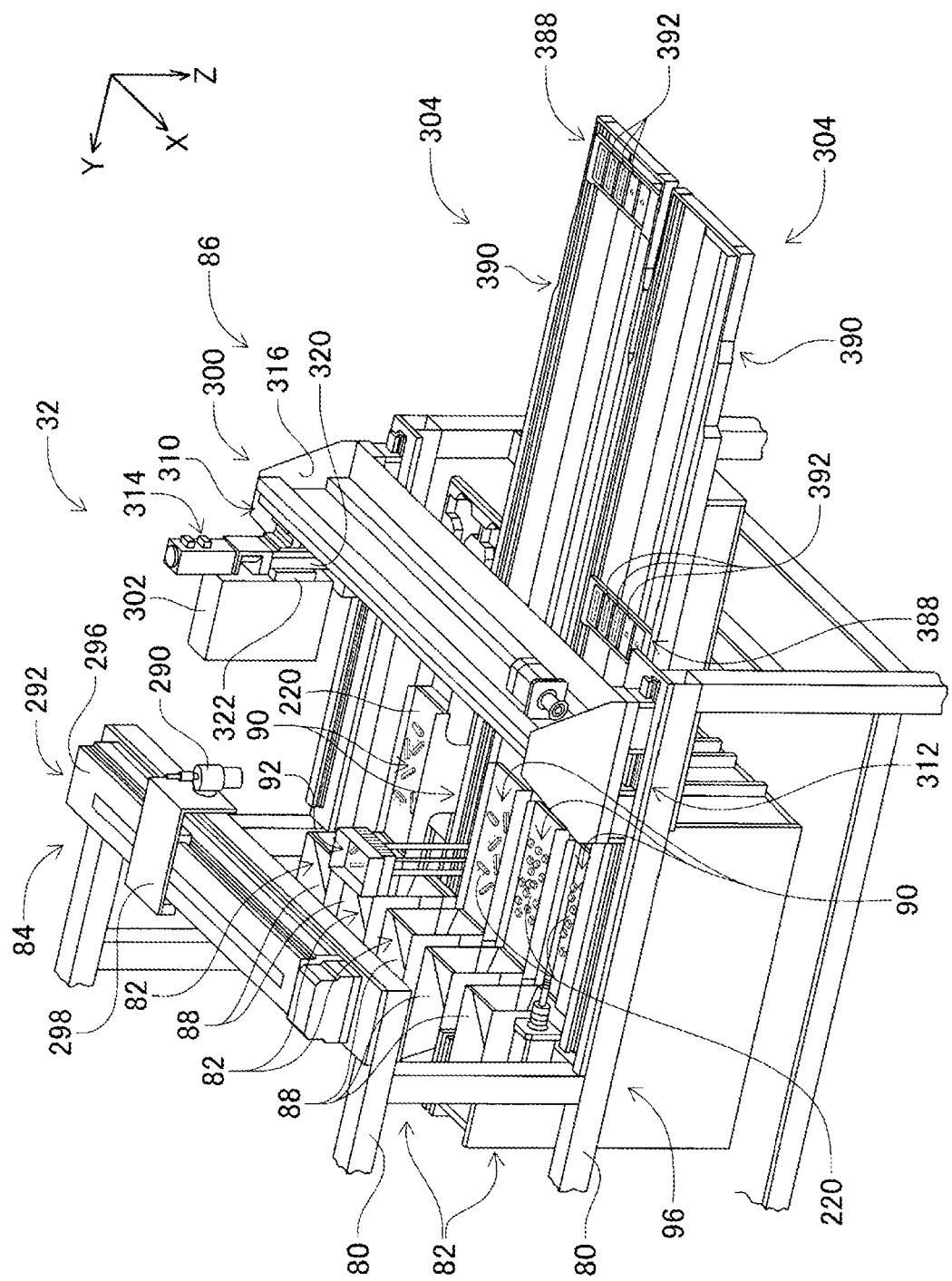
FIG. 3 is a perspective view of a loose component supply device.

As shown in FIG. 3, loose component supply device 32 includes main body 80, component supply unit 82, imaging device 84, and component transfer device 86.

(a) Component Supply Unit

Component supply unit 82 includes component supply apparatus 88, component scattering device 90, and component returning device 92, with those supply apparatus 88, component scattering device 90, and component returning device 92 configured to be integrated as one. Component supply unit 82 is assembled to be removable from base 96 of main body 80, and with loose component supply device 32, five component supply units 82 are arranged in one row in the X direction.

(i) Component Supply Apparatus

Figure 4:
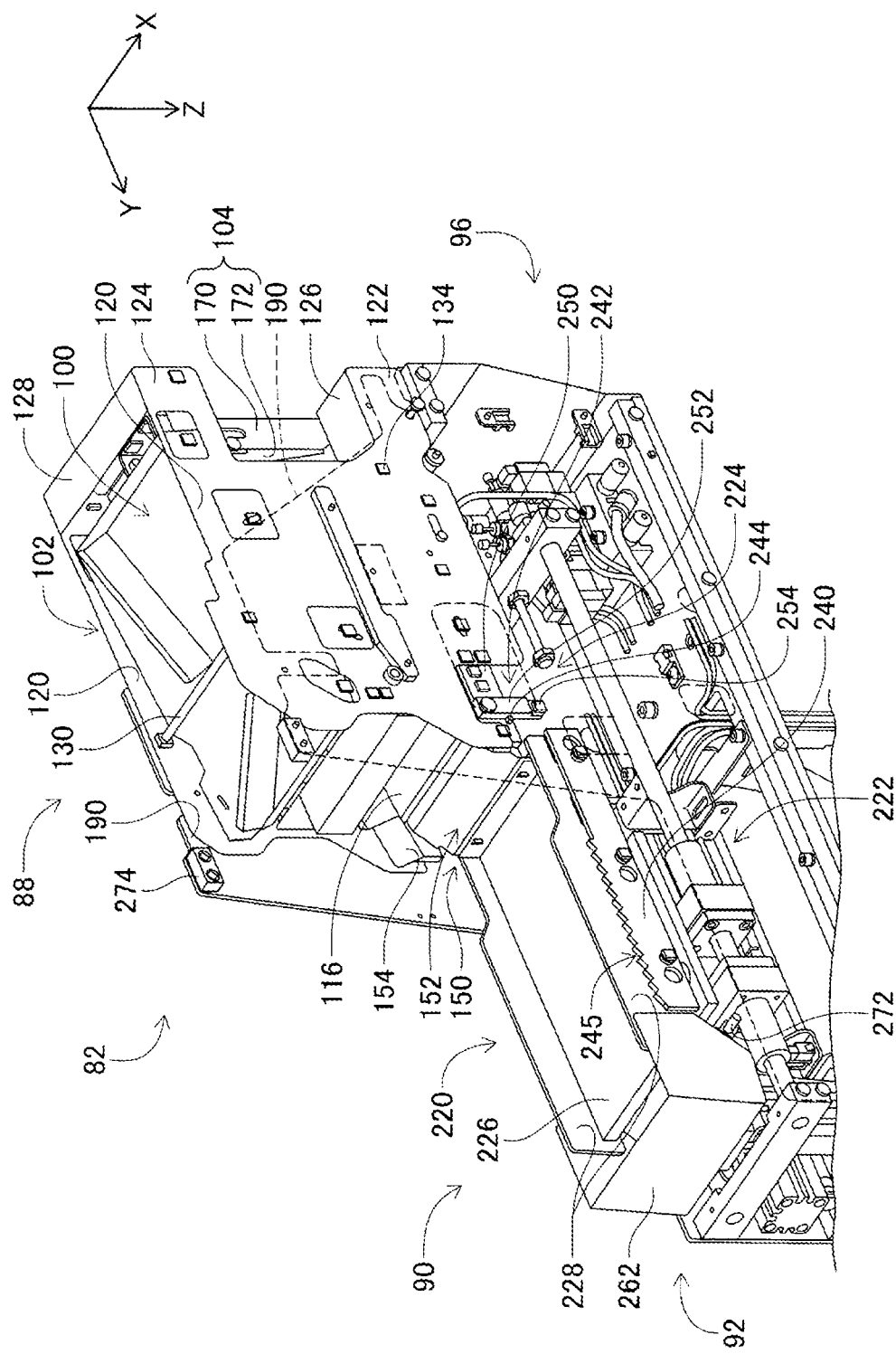
FIG. 4 is a perspective view of a component supply unit.

As shown in FIG. 4, component supply apparatus 88 includes component storage apparatus 100, housing 102, and grip 104. Component storage apparatus 100 has a general shape of a rectangular parallelepiped and is open at the top surface and a front surface. The bottom surface of component storage apparatus 100 is inclined surface 116, which is inclined towards the open front surface of component storage apparatus 100.

Housing 102 includes pair of side walls 120, and component storage apparatus 100 is swingably held between the pair of side walls 120. Also, inclined plate 152 is fixedly arranged between the pair of side walls 120 so as to be positioned in front of the lower end of the front surface of component supply apparatus 100. Inclined plate 152 is inclined downwards towards the front side.

Grip 104 is arranged on the rear end of housing 102 and is configured from fixed holding member 170 and movable holding member 172. Movable holding member 172 is able to move towards and away from fixed holding member 170. Also, movable holding member 172 is connected to the rear surface of component storage apparatus 100 by a connecting arm (not shown). By this, by gripping grip 104, movable holding member 172 is moved towards and away from fixed holding member 170, and component storage apparatus 100 swings between the pair of side walls 120.

Also, component supply apparatus 88 is provided between the pair of side frame sections 190 assembled to base 96 and can be attached to and removed from base 96. Note that, a lock mechanism (not shown) is provided on a lower end of movable holding member 172 of grip 104, and the lock mechanism is released by grip 104 being gripped. That is, by an operator raising component supply apparatus 88 in a state gripping grip 104 of component supply apparatus 88, component supply apparatus 88 is removed from the pair of side frame sections 190.

(ii) Component Scattering Device

Component scattering device 90 includes component support member 220, component support member moving device 222, and supply apparatus oscillating device 224. Component support member 220 is configured from stage 226 and side wall sections 228. Stage 226 is a roughly rectangular plate, and is provided to extend forwards from below inclined plate 152 of component supply apparatus 88. Note that, stage 226 is removably attached to a base (not shown) of component support member 220 via a bolt. Also, side walls 228 are fixed to the base of component supply member 220 so as to enclose both side sections of stage 226 in the lengthwise direction.

Component support member moving device 222 is for moving component support member 220 forwards and backwards by the driving of electromagnetic motor (refer to FIG. 8) 223. By this, component support member 220 moves forwards and backwards slightly below the lower end of inclined plate 152 of component supply apparatus 88 in a state with the upper surface of component support member 220 horizontal.

Supply apparatus oscillating device 224 includes cam member 240, cam follower 242, and stopper 244. Cam member 240 is roughly a plate and is fixed to an outer side surface of side wall section 228 extending in a front-rear direction. Multiple teeth 245 are formed at regular intervals in the front-rear direction on the upper end section of cam member 240. Cam follower 242 includes lever 252 and roller 254. Lever 252 is provided on the lower end section of side wall 120 of component supply apparatus 88 and is swingable around the upper end section. Roller 254 is held to be rotatable at the lower end section of lever 252. Note that, lever 252 is biased in a direction facing forwards by the elastic force of a coil spring (not shown). Also, stopper 244 is provided protruding from side wall 120, and lever 252 biased by the elastic force of the coil spring contacts stopper 244.

(iii) Component Returning Device

Figure 5:
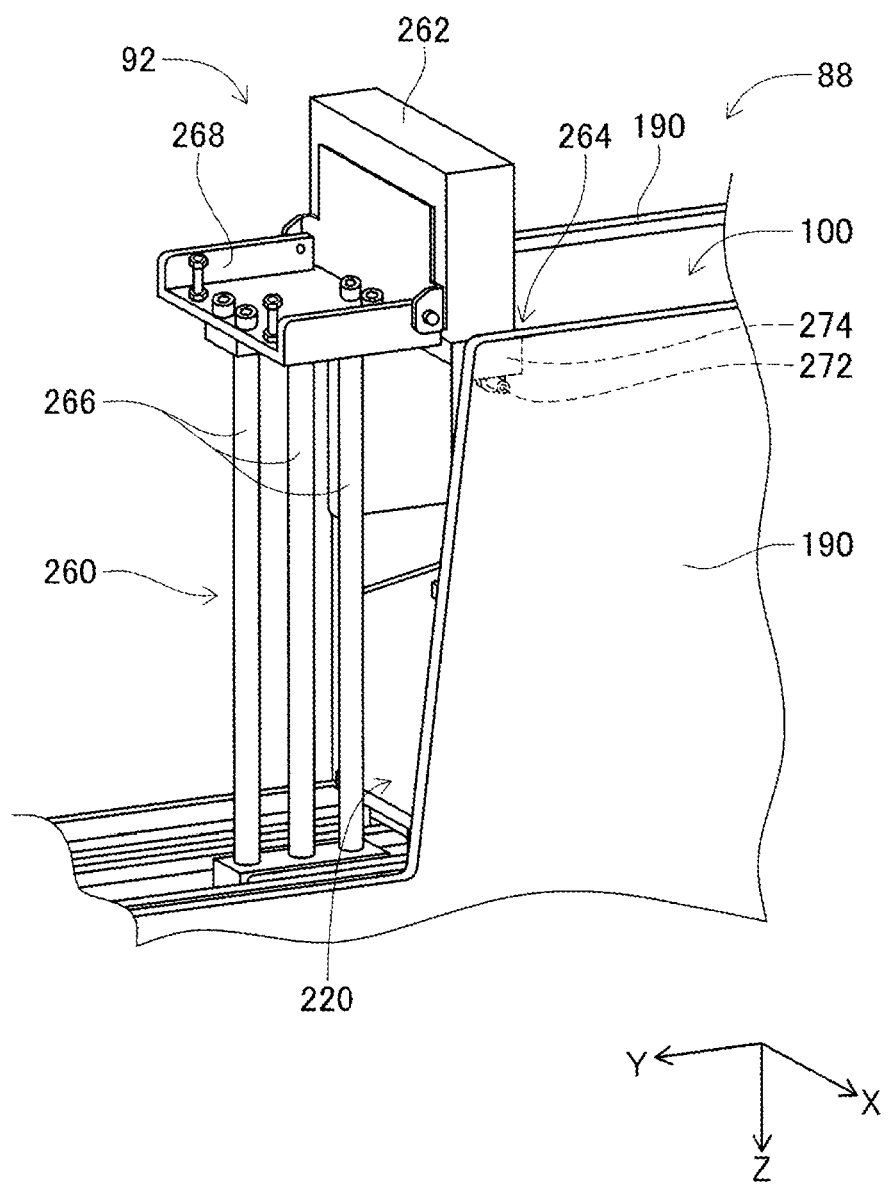
FIG. 5 is a perspective view showing the component supply unit in a state with a component collection container raised to an upper limit position.

As shown in FIG. 5, component returning device 92 includes container raising and lowering device 260, and component collection container 262. Container raising and lowering device 260 includes air cylinder 266 and raising and lowering member 268, and raising and lowering member 268 is raised and lowered by operation of air cylinder 266. Also, air cylinder 266 is fixed to the front side end of component support member 220. Accordingly, air cylinder 266 moves forwards and backwards together with component support member 220 by operation of component support member moving device 222.

Component collection container 262 is provided on the upper surface of raising and lowering member 268 and is moved up and down by operation of air cylinder 266. Component collection container 262 is a box that is open at the end and is rotatably held at the top surface of raising and lowering member 268. As shown in FIG. 4, protruding pin 272 is provided on the rear side end section of component collection container 262. Protruding pin 272 protrudes towards the outside on the side of component collection container 262. Further, engaging block 274 is fixed to the inside of the front side top end section of side frame section 190. Also, as shown in FIG. 5, when component collection container 262 is raised to the raised position by operation of air cylinder 266, protruding pin 272 engages with engaging block 274. By this, component collection container 262 rotates.

(b) Imaging Device

As shown in FIG. 3, imaging device 84 includes camera 290 and camera moving device 292. Camera moving 292 includes guide rail 296 and slider 298. Guide rail 296 is fixed to main body 80 above component supply apparatus 82 so as to extend in the width direction of loose component supply device 32. Slider 298 is slidably attached to guide rail 296, and can be slid to any position by operation of electromagnetic motor (refer to FIG. 8) 299. Also, camera 290 is attached to slider 298 facing downwards.

(c) Component Transfer Device

As shown in FIG. 3, component transfer device 86 includes component holding head moving device 300, component holding head 302, and two shuttle devices 304.

Component holding head moving device 300 includes X-direction moving device 310, Y-direction moving device 312, and Z-direction moving device 314. Y-direction moving device 312 includes Y slider 316 provided above component supply unit 82 extending in the X direction, and Y slider 316 is moved to any position in the Y direction by operation of electromagnetic motor (refer to FIG. 8) 319. X-direction moving device 310 includes X slider 320 provided on a side surface of Y slider 316, and X slider 320 is moved to any position in the X direction by operation of electromagnetic motor (refer to FIG. 8) 321. Z-direction moving device 314 includes Z slider 322 provided on a side surface of X slider 320, and Z slider 322 is moved to any position in the Z direction by operation of electromagnetic motor (refer to FIG. 8) 323.

Figure 6:
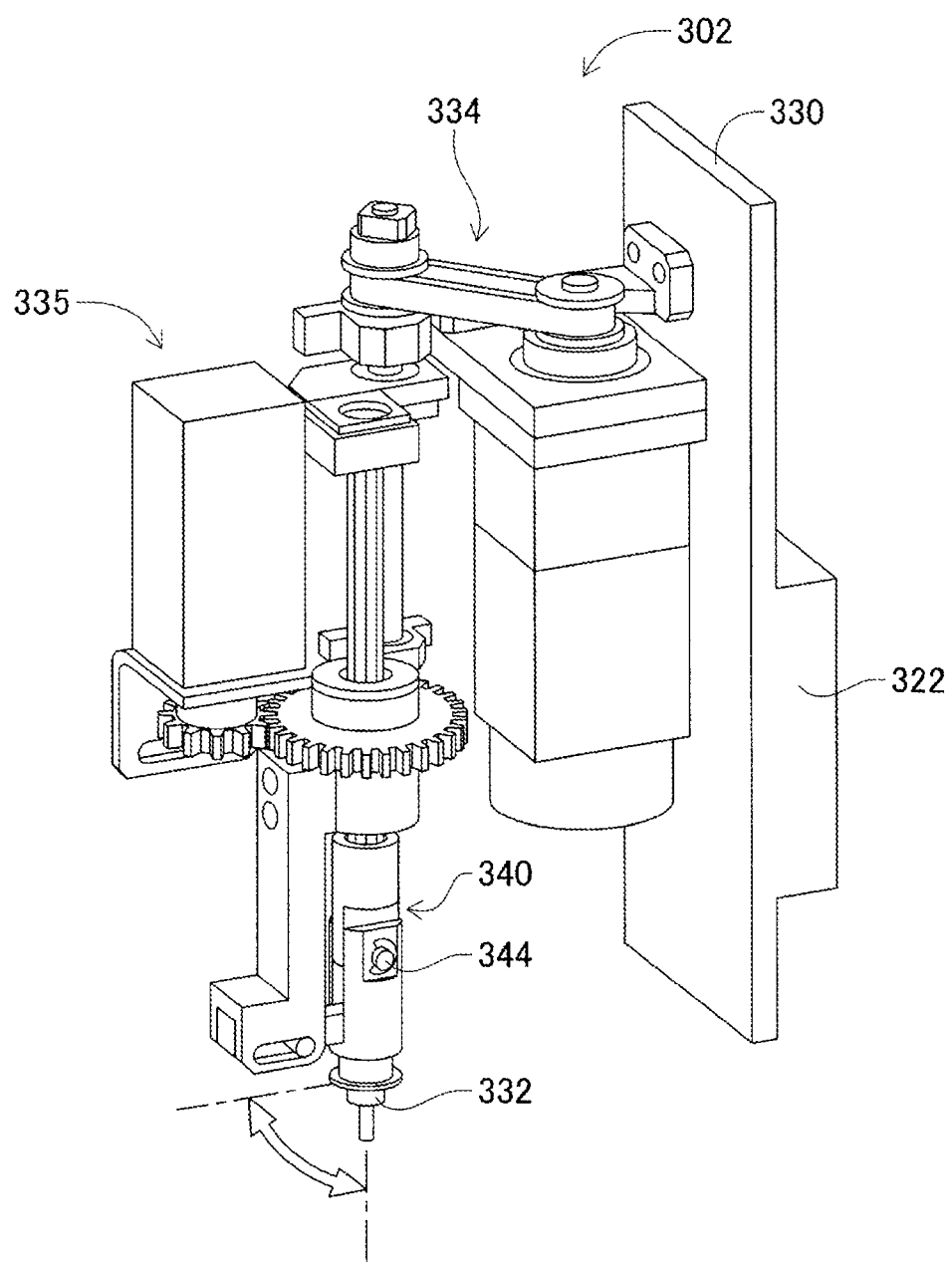
FIG. 6 is a perspective view of a component holding head.

As shown in FIG. 6, component holding head 302 includes head main body 330, suction nozzle 332, nozzle pivoting device 334, and nozzle rotating device 335. Head main body 330 is formed as one body with Z slider 322. Suction nozzle 332 is for holding a component, and is detachably attached to a lower end section of holder 340. Holder 340 is able to bend at support shaft 344, and holder 340 bends 90 degrees in an up direction by operation of nozzle pivoting device 334. By this, suction nozzle 332 attached to the bottom end of holder 340 is pivoted 90 degrees to be positioned at the pivoted position. That is, suction nozzle 332 is able to be pivoted to and from a non-pivoted position and a pivoted position by operation of nozzle pivoting device 334. Further, nozzle rotating device 335 rotates suction nozzle 332 around its own center axis.

Further, as shown in FIG. 3, each of the two shuttle devices 304 includes component carrier 388, and component carrier moving device 390, and is fixed to main body 80 lined up in the sideways direction on the front side of component supply unit 82. Five component receiving members 392 are attached to component carrier 388 lined up in a single row sideways, and components are loaded on each component receiving member 392.

Figure 7:
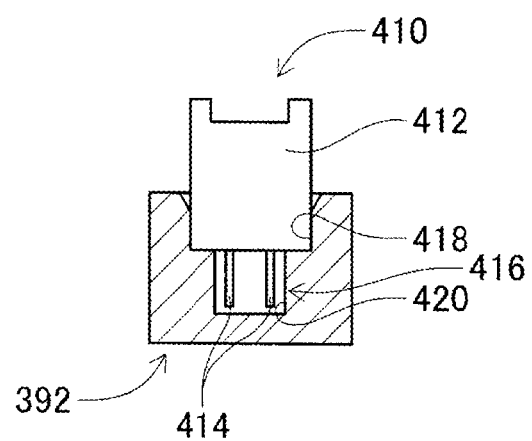
FIG. 7 shows a component receiving member in which is stored a leaded component.

In detail, as shown in FIG. 7, components supplied by loose component supply device 32 are electronic circuit components 410 that have leads (hereinafter also referred to as "leaded components"), being configured from a block-like component main body 412, and two leads 414 that protrude from the bottom surface of component main body 412. Also, component reception recess 416 is formed in component receiving member 392. Component reception recess 416 is a stepped recess configured from main body section reception recess 418 open at the top surface of component receiving member 392, and lead reception recess 420 open at the bottom surface of main body section reception recess 418. Leaded component 410 is inserted inside component reception recess 416 with leads 414 pointing downwards. Therefore, leaded component 410 is loaded inside component reception recess 416 with leads 414 inserted into lead reception recess 420 and component main body 412 inserted into main body section reception recess 418.

Also, as shown in FIG. 3, component carrier moving device 390 is a long plate member provided on the front side of component supply unit 82 extending in the front-rear direction. Component carrier 388 is provided on the upper surface of component carrier moving device 390 to be slidable in the front-rear direction, and is slid to any position in the front-rear direction by operation of electromagnetic motor (refer to FIG. 8) 430. Note that, component carrier 388, when slid in a direction approaching component supply unit 82, is slid to a component receiving position that is positioned within the movement range of component holding head 302 by component holding head moving device 300. Conversely, when slid in a direction away from component supply unit 82, component carrier 388 is slid to a component supply position that is positioned within the movement range of work heads 60 and 62 by work head moving device 64.

Figure 8:
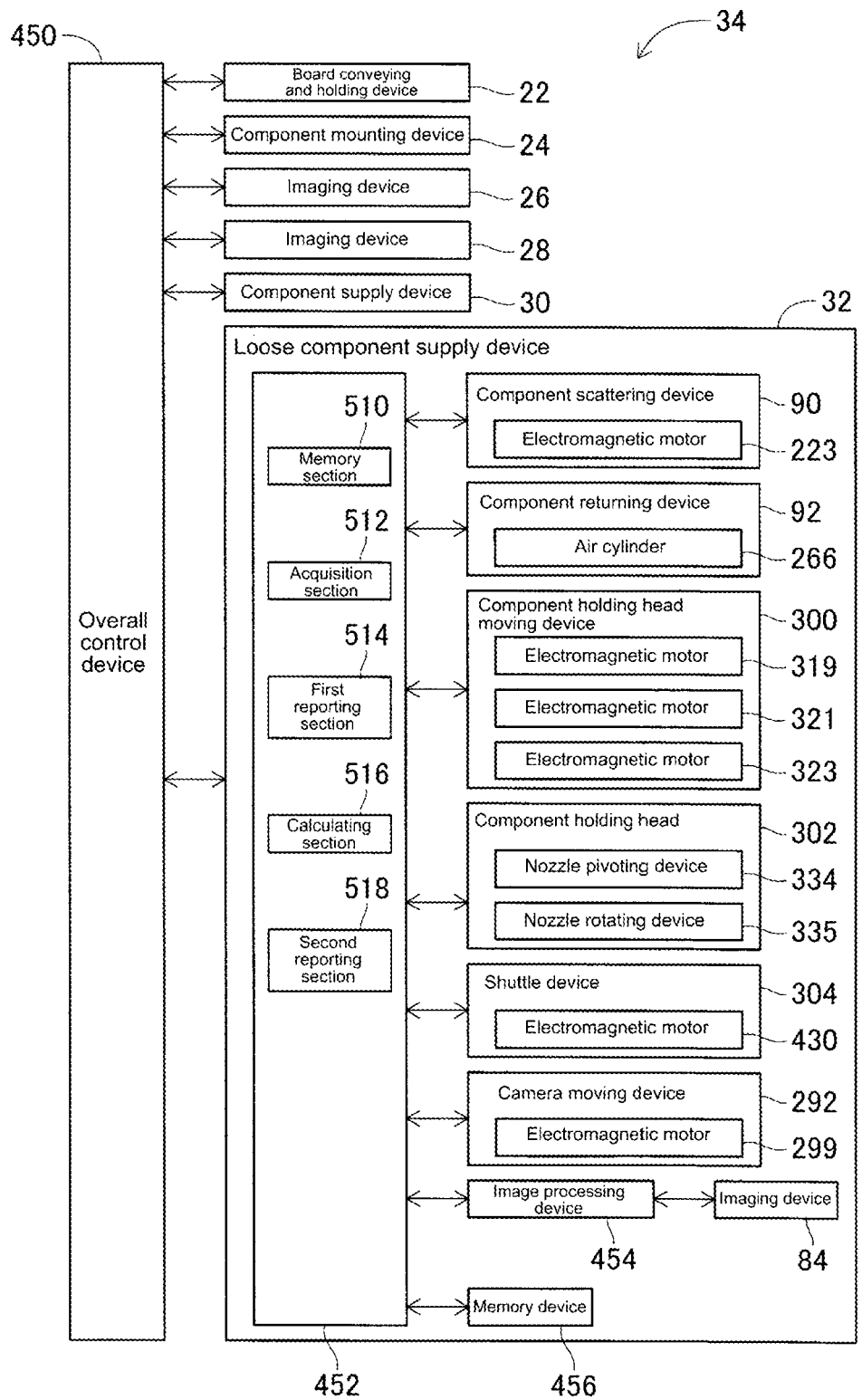
FIG. 8 is a block diagram showing a control device of the component mounter.

Further, as shown in FIG. 8, control device 34 includes overall control device 450, multiple individual control devices (only one is shown in the FIG. 452, image processing device 454, and memory device 456. Overall control device 450 is configured mainly from a computer and is connected to board conveying and holding device 22, component mounting device 24, imaging device 26, imaging device 28, component supply device 30, and loose component supply device 32. Thus, overall control device 450 performs overall control of board conveying and holding device 22, component mounting device 24, imaging device 26, imaging device 28, component supply device 30, and loose component supply device 32. The multiple individual control devices 452 are configured mainly from a computer and are provided corresponding to board conveying and holding device 22, component mounting device 24, imaging device 26, imaging device 28, component supply device 30, and loose component supply device 32 (in the figure, only individual control device 452 corresponding to loose component supply device 32 is shown). Individual control device 452 of loose component supply device 32 is connected to component scattering device 90, component returning device 92, camera moving device 292, component holding head moving device 300, component holding head 302, and shuttle device 304. Accordingly, individual control device 452 of loose component supply device 32 controls component scattering device 90, component returning device 92, camera moving device 292, component holding head moving device 300, component holding head 302, and shuttle device 304. Also, image processing device 454 is connected to imaging device 84 and processes image data captured by imaging device 84. Image processing device 454 is connected to individual control device 452 of loose component supply device 32. By this, individual control device 452 of loose component supply device 32 acquires image data captured by imaging device 84. Also, memory device 456 memorizes various types of data and is connected to individual control device 452. By this, individual control device 452 acquires various types of data from memory device 456.

Component Mounter Operation

Component mounter 10, according to the above configuration, mounts components on circuit board 12 held by board conveying and holding device 22. Specifically, circuit board 12 is conveyed to a work position, and is fixedly held at that position by clamp device 52. Next, imaging device 26 moves above circuit board 12 and images circuit board 12. By this, information related to a holding position error of circuit board 12 is obtained. Also, component supply device 30 or loose component supply device 32 supplies components at a specified supply position. Component supply by loose component supply device 32 is described in detail later. One of the work heads 60 or 62 moves above the component supply position and holds a component using suction nozzle 66. Then, work head 60 or 62 holding the component moves above imaging device 28, and the component being held by suction nozzle 66 is imaged by imaging device 28. Accordingly, information related to an error of the holding position of the component is obtained. Next, work head 60 or 62 holding the component moves above circuit board 12, and mounts the held component on circuit board 12 after correcting for the error in the holding position of circuit board 12 and the error in the holding position of the component and so on.

Operation of Loose Component Supply Device (a) Supply of Leaded Components Using Loose Component Supply Device With loose component supply device 32, leaded components 410 are inserted by an operator into component storage apparatus 100 of component supply apparatus 88, then, the inserted leaded components 410 are supplied in a state loaded on component receiving member 392 of component carrier 388 by operation of component supply unit 82 and component transfer device 86. In detail, the operator inserts leaded components 410 via the entrance in the top surface of component storage apparatus 100 of component supply apparatus 88. Here, component support member 220 is moved below component supply apparatus 88 by operation of component support member moving device 222, and component collection container 262 is positioned in front of component supply apparatus 88.

Leaded components 410 inserted via the entrance on the top surface of component storage apparatus 100 fall onto inclined surface 116 of component storage apparatus 100 and spread out on inclined surface 116. Here, in a case in which leaded components 410 that have fallen onto inclined surface 116 roll and fall beyond inclined plate 152, they are collected in component collection container 262 positioned in front of component supply apparatus 88.

Figure 9:
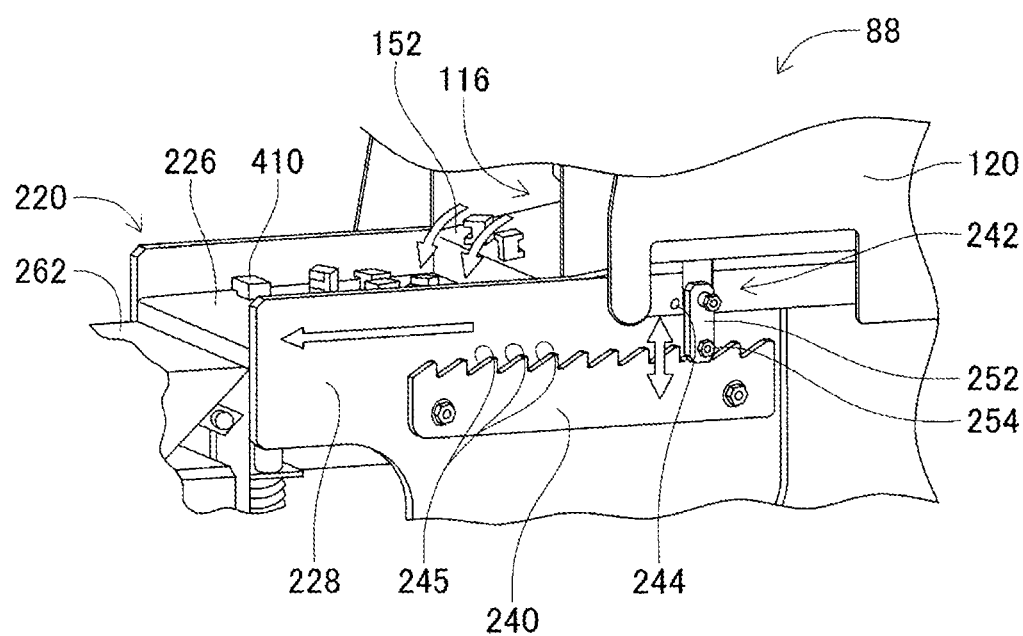
FIG. 9 is a perspective view of a component scattering device.

After leaded components 410 have been inserted into component storage apparatus 100, component support member 220 is moved forwards from below component supply apparatus 88 by operation of component support member moving device 222. Here, as shown in FIG. 9, as cam member 240 engages with cam follower 242, roller 254 of cam follower 242 rides over teeth 245 of cam member 240. Lever 252 of cam follower 242 is biased in a direction facing forwards by the elastic force of a coil spring, with the biasing forward of lever 252 being regulated by stopper 244. Therefore, when component support member 220 is moved forwards, roller 254 and teeth 245 are maintained in an engaged state, and roller 254 rides over teeth 245 without lever 252 being rotated forwards. Here, component supply apparatus 88 is raised by the riding over of teeth 245 by roller 254. That is, with roller 254 engaged with teeth 245, component support member 220 is moved forward, such that roller 254 rides over multiple teeth 245 and component supply apparatus 88 is oscillated by being consecutively moved up and down.

Leaded components 410 spread out on inclined surface 116 of component supply apparatus 100 are moved forwards by the oscillation of component supply apparatus 88 and the incline of inclined surface 116, and are ejected onto stage 226 of component support member 220 via inclined plate 152. Here, leaded components 410 are prevented from falling from stage 226 by side wall sections 228 of component support member 220. And, by component support member 220 being moved forwards, leaded components 410 are scattered on the upper surface of stage 226.

Figure 10:
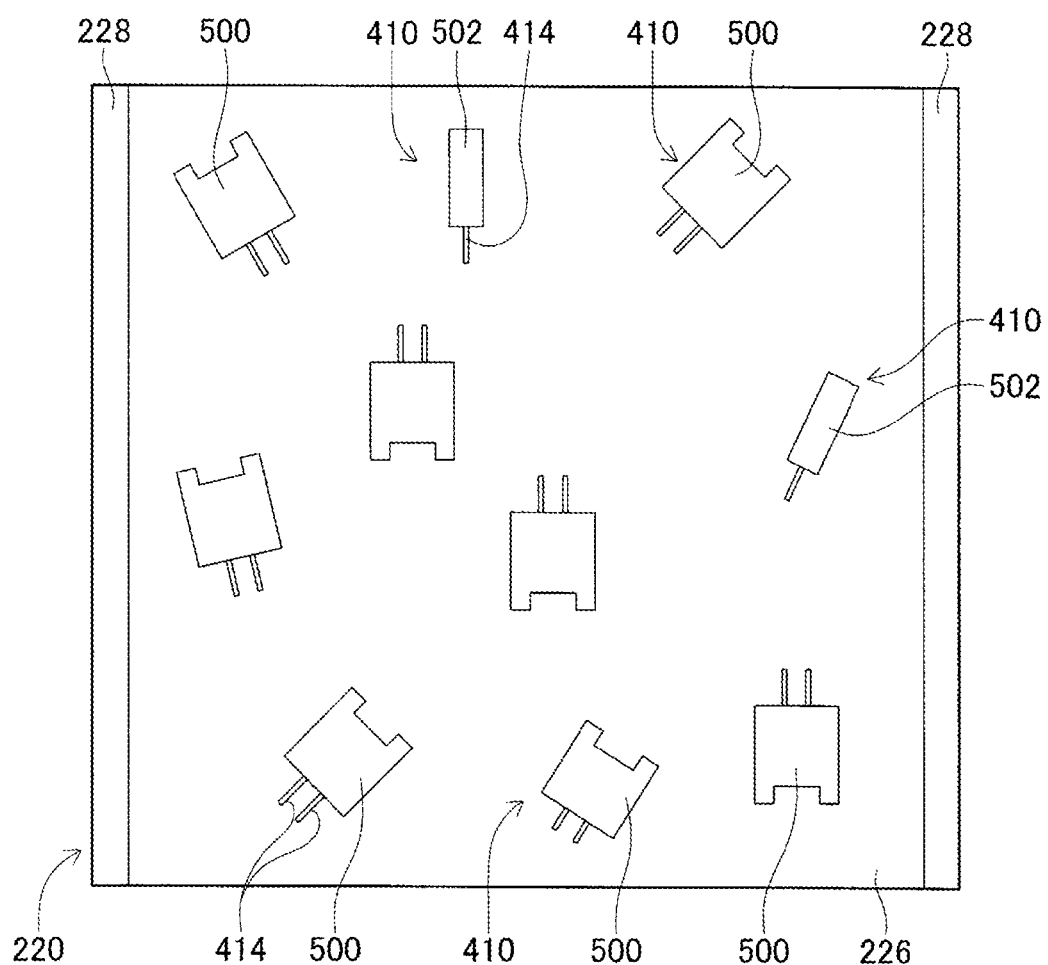
FIG. 10 shows a state in which white leaded components are scattered on a white stage.

Note that, when leaded components 410 are scattered on stage 226 of component support member 220 from component storage apparatus 100, as shown in FIG. 10, leaded components 410 are scattered on stage 226 in largely two orientations. Specifically, leaded components 410 are scattered on stage 226 in two orientations: an orientation in which the two leads 414 are in a state approximately lined up in a horizontal direction (also referred to as a "first orientation"), and an orientation in which the two leads 414 are in a state approximately lined up in a vertical direction (also referred to as a "second orientation").

When leaded components 410 are scattered on stage 226 as above, camera 290 of imaging device 84, by operation of camera moving device 292, moves above component support member 220 and images leaded components 410. Then, based on the image data imaged by camera 290, a leaded component that is a target for pickup (also referred to as "pickup target component") is identified.

Specifically, based on image data of camera 290, the orientation and position of each of the multiple components scattered on stage 226 is calculated. Then, only leaded components 410 for which the calculated component orientation was the first orientation are identified as pickup target components. This is because, for leaded components 410 in the first orientation, side surface 500 with a large surface area is facing upwards, and it is possible to hold side surface 500 with suction nozzle 332, but for leaded components 410 in the second orientation, side surface 502 with a small surface area is facing upwards, and it is not possible to hold side surface 502 using suction nozzle 332.

Then, when a pickup target component has been identified, that identified pickup target component is picked up and held by suction nozzle 332, but in a case in which the color of stage 226 and the color of leaded component 410 are similar, it may not be possible to appropriately identify a pickup target component. Specifically, for example, stage 226 shown in FIG. 10 is approximately white. However, the color of leaded components 410 scattered on stage 226 is also approximately white. In this case, with image data imaged by camera 290 from above stage 226, because the difference between the background color (color of stage 226) and the color of the target item (color of leaded components 410) is small, the outline of leaded components 410 is not clear, and it may not be possible to determine the orientation and so on of the leaded components 410.

Figure 11:
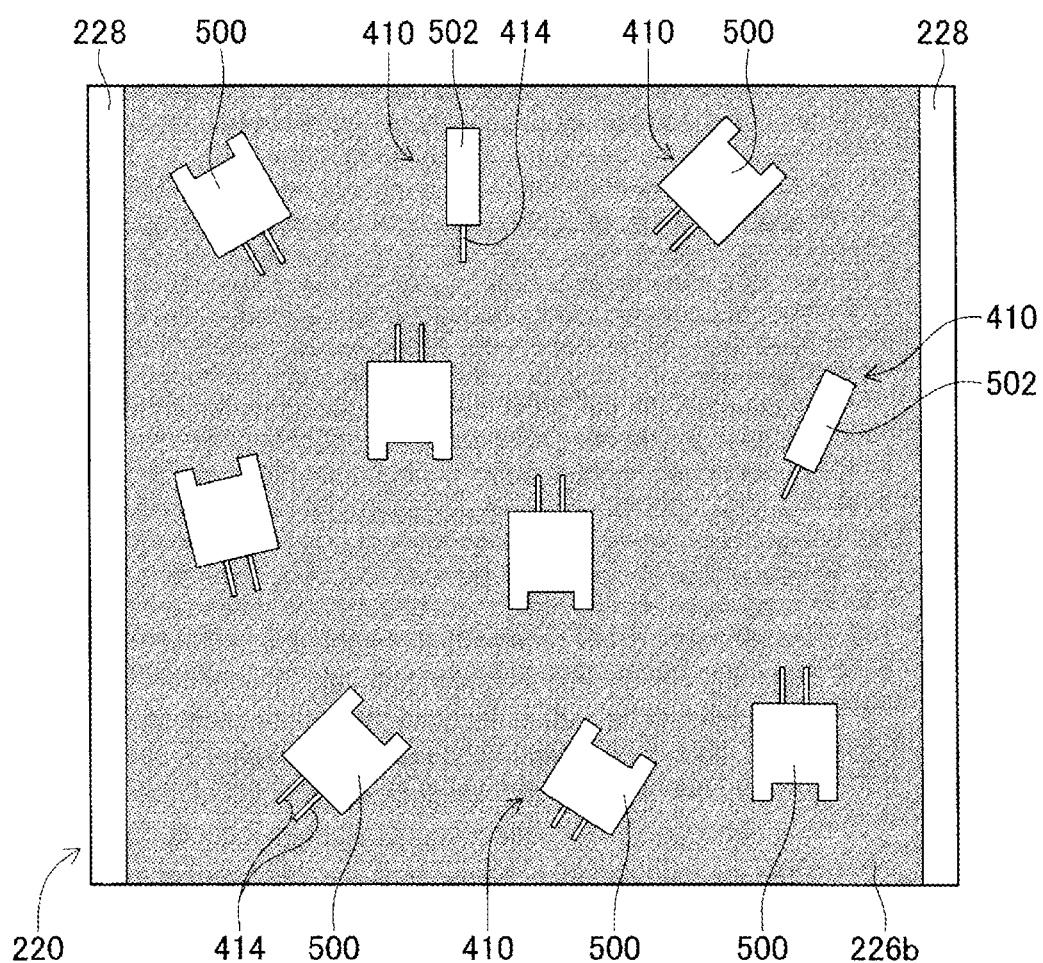
FIG. 11 shows a state in which white leaded components are scattered on a black stage.

Therefore, with loose component supply device 32, stage 226 is changed in accordance with the color of leaded component 410. In detail, as described above, stage 226 is removably attached to a base of component support member 220. And, with loose component supply device 32, two types of stages are prepared: stage 226a with a white component support surface, and stage 226b with a black component support surface. Therefore, in a case in which white leaded components 410 are planned to be supplied by loose component supply device 32, as shown in FIG. 11, black stage 226b is attached to component support member 220. By this, as is evident from the figure, because the difference between the background color (color of stage 226) and the color of the target item (color of leaded components 410) is large, the outline of leaded components 410 is clear, and it is possible to appropriately determine the orientation and so on of the leaded components 410.

Figure 12:
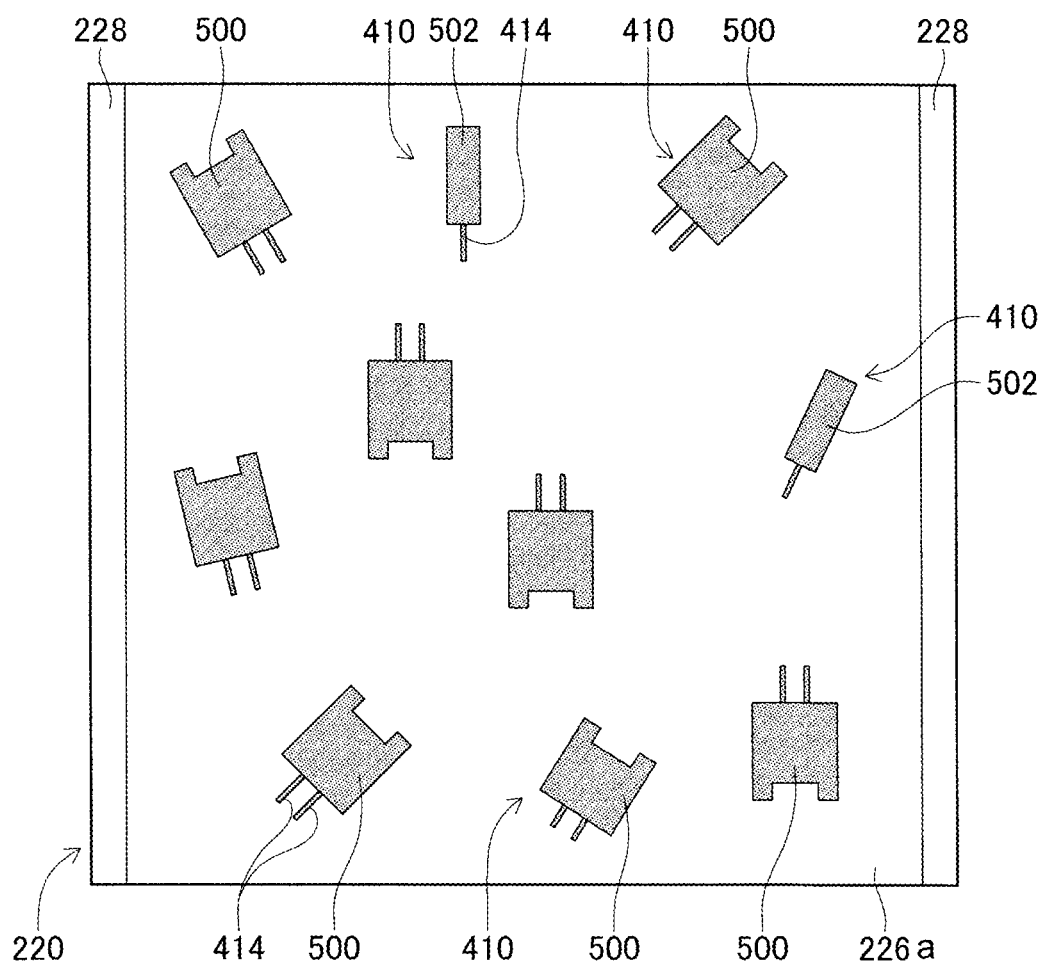
FIG. 12 shows a state in which black leaded components are scattered on a white stage.

Also, in a case in which black leaded components 410 are planned to be supplied by loose component supply device 32, as shown in FIG. 12, white stage 226a is attached to component support member 220. By this, as is evident from the figure, because the difference between the background color (color of stage 226) and the color of the target item (color of leaded components 410) is large, the outline of leaded components 410 is clear, and it is possible to appropriately determine the orientation and so on of the leaded components 410.

In this manner, with loose component supply device 32, by attaching a stage 226 with a different color to the color of the leaded component 410 planned to be supplied to component support member 220, it is possible to appropriately determine the orientation and the like of leaded components 410. Note that, with loose component supply device 32, guidance regarding the stage in accordance with the leaded components 410 is displayed by an operator entering information related to the leaded components 410 that are planned to be supplied.

In detail, a link between leaded components and a stage with a different color to the color of that leaded component is memorized in individual control device 452 of loose component supply device 32. That is, white leaded components are linked to black stage 226b, and black leaded components are linked to white stage 222a. And, when an operator enters information related to a leaded component that is planned to be supplied, a stage 226 linked to the leaded component in accordance with the information is identified, and information indicating guidance for the identified stage 226 is displayed on an operation panel (not shown). By this, an operator can attach a stage 226 in accordance with the color of a leaded component that is planned to be supplied to component support member 220.

Further, in a case in which a stage of a similar color to that of a leaded component 410 that is planned to be supplied is attached to component support member 220 without using the function of displaying guidance for the stage as described above, that is, as shown in FIG. 10, in a case in which white stage 226a is attached to component support member 220 even though the leaded component 410 that is planned to be supplied is white, there is a risk that the orientation and so on of the leaded component 410 will not be appropriately recognized. Therefore, in such a case, information indicating that the orientation and so on of the leaded component 410 may not be appropriately recognized is displayed on the display panel.

In detail, when leaded components 410 scattered on stage 226 of component supply member 220 are imaged by camera 290, based on the image data, the quantity of leaded components on stage 226, and the quantity of leaded components 410 for which the component orientation and so on is recognizable are calculated. Further, a ratio (also referred to as "recognition rate") of the quantity of leaded components 410 for which the component orientation and so on is recognizable with respect to the quantity of leaded components on stage 226 is calculated. Then, it is determined whether the recognition rate is lower than a threshold rate, and in a case in which the recognition rate is lower than the threshold rate, because the recognition rate is low, information indicating that it may not be possible to appropriately recognize the orientation and so on of leaded components 410 is displayed on the display panel. By this, it is possible to prompt the operator to exchange stage 226, such that a stage 226 with a different color to the leaded component 410 that is planned to be supplied is attached to component support member 220.

In this manner, with loose component supply device 32, using the stage guidance display function and displaying of a screen indicating that the recognition rate is low, it is possible to reliably attach a stage 226 with a different color to the leaded component 410 that is planned to be supplied to component support member 220.

Also, when a pickup target component is identified by following the above procedure, that pickup target component is held by suction nozzle 332 of component holding head 302. Note that, when the pickup target component is picked up and held by suction nozzle 332, suction nozzle 332 is in the non-pivoted position. Then, after holding leaded component 410 using suction nozzle 332, component holding head 302 is moved above component carrier 388. Then, component carrier 388 is moved to the component receiving position by operation of component carrier moving device 390. Also, when component holding head 302 is moved above component carrier 388, suction nozzle 332 is pivoted to the pivoted position. Note that, suction nozzle 332 is rotated by operation of nozzle rotating device 335 such that leads 414 of the leaded component 410 held by suction nozzle 332 that is in the pivoted position face downwards in a vertical direction.

When component holding head 302 is moved above component carrier 388, leaded component 410 in a state with leads 414 facing downwards in the vertical direction is inserted into component reception recess 416 of component reception member 392. By this, as shown in FIG. 7, leaded component 410 is loaded in component receiving member 392 with leads 414 facing vertically downwards.

Also, when leaded component 410 is loaded on component receiving members 392, component carrier 388 is moved to the component supply position by operation of component carrier moving device 390. With loose component supply device 32, because component carrier 388 moved to the component supply position is within the movement range of work heads 60 and 62, leaded components 410 are supplied at this position. In this manner, with loose component supply device 32, leaded components 410 are supplied with leads 414 pointing downwards, and with the upper surface that is opposite tp the bottom surface to which leads 414 are connected facing upwards. Therefore, suction nozzle 66 of work head 60 or 62 is able to appropriately hold leaded component 410.

(b) Collection of Leaded Components

Figure 13:
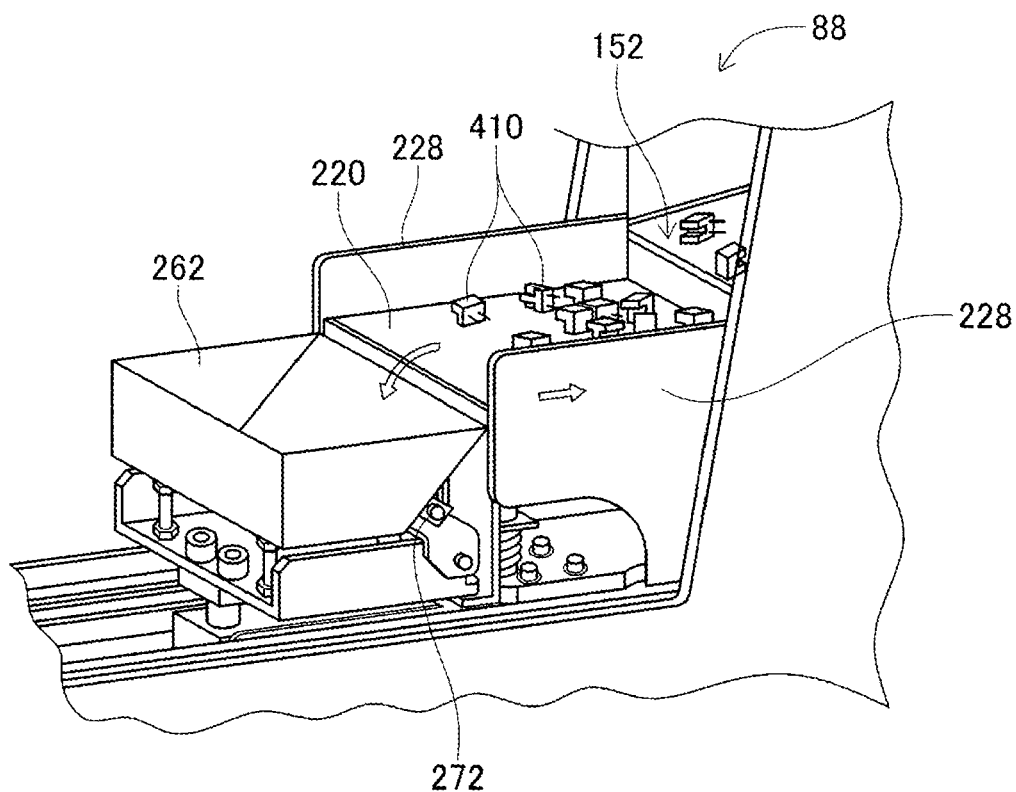
FIG. 13 is a perspective view of a component scattering device and a component returning device.

Further, with loose component supply device 32, leaded components 410 scattered on component support member 220 can be collected. In detail, component support member 220 is moved below component supply apparatus 88 by operation of component support member moving device 222. Here, as shown in FIG. 13, leaded components 410 on stage 226 of component support member 220 are stopped by inclined plate 152 of component supply apparatus 88, such that leaded components 410 on stage 226 are scraped into component collection container 262.

Next, component collection container 262 is raised by operation of container raising and lowering device 260. Here, as shown in FIG. 5, protruding pin 272 provided on component collection container 262 engages with engaging block 274 provided on the inside of side frame section 190. By this, component collection container 262 is rotated and leaded components 410 inside component collection container 262 are returned inside component storage apparatus 100.

By an operator gripping the grip of component supply apparatus 88, as described above, component supply apparatus 88 is unlocked, and by the operator raising component supply apparatus 88, component supply apparatus 88 is removed from the pair of side frame sections 190. By this, leaded components 410 are collected from component supply apparatus 88 outside of loose component supply device 32.

Note that, as shown in FIG. 8, individual control device 452 of loose component supply device 32 includes memory section 510, acquisition section 512, first reporting section 514, calculating section 516, and second reporting section 518. Memory section 510 is a functional section for memorizing a link between a leaded component and a stage with a different color to the color of that leaded component. Acquisition section 512, when the above stage guidance display function is used, is a functional section for acquiring information related to leaded components entered by an operator. First reporting section 514 is a functional section for displaying on the display panel a stage appropriate for a leaded component in accordance with information entered by an operator. Calculating section 516 is a functional section for calculating a recognition rate. Second reporting section 518 is a functional section for, in a case in which the recognition rate is lower than a threshold rate, displaying that fact on the display panel.

Further, the present disclosure is not limited to the above example embodiments, and various changed or improved methods of embodiment are possible based on the knowledge of someone skilled in the art. Specifically, for example, in the above embodiment, stage 226 is exchanged in accordance with the color of the component that is planed to be supplied, but stage 226 may be exchanged in accordance with the shape of the component that is planed to be supplied.

Figure 14:
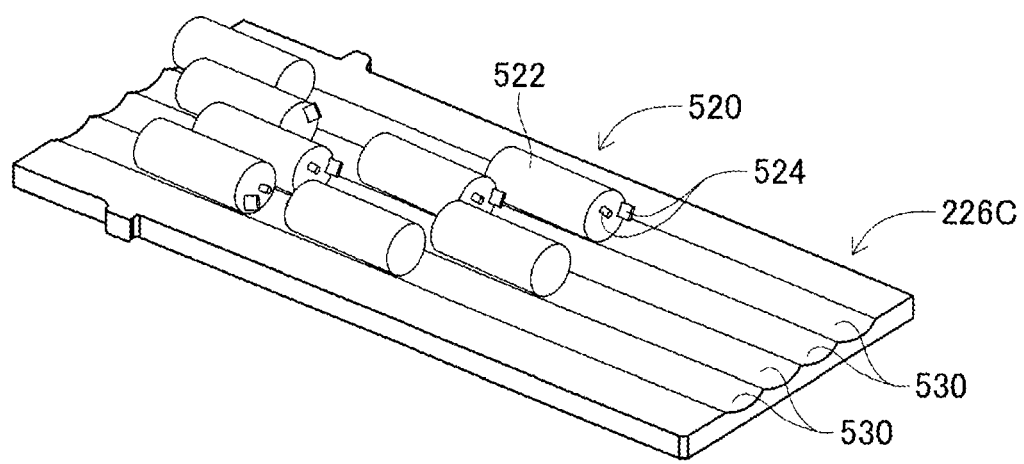
FIG. 14 shows a state in which cylindrical components are scattered on a stage formed with grooves.

Specifically, for example, consider a case in which the component that is planned to be supplied is an electrolytic capacitor. As shown in FIG. 14, electrolyte capacitor 520 is configured from approximately cylindrical component main body 522, and leads 524 arranged on the bottom surface of component main body 522. Therefore, when scattered on the above stages 226a or 226b, electrolyte capacitor 520 rolls on the stage 226a or 226b, such that electrolyte capacitor 520 may not be able to be held appropriately.

Thus, in addition to stages 226a and 226, another stage, 226c, is prepared for loose component supply device 32. Multiple grooves 530 with a shape according to the outer diameter of component main body 522 of electrolyte capacitor 520 are formed on stage 226c. Thus, by attaching stage 226c to component support member 220, electrolyte capacitor 520 scattered on stage 226c sits inside groove 530. By this, electrolyte capacitor 520 scattered on stage 226c is prevented from rolling, and electrolyte capacitor 520 can be held appropriately.

Further, in an embodiment above, only two colors of stages, black stage 226a and white stage 226b are prepared, but other colors of stages, such as brown or red, may be prepared, and any one of those stages may be attached to component support member 220.

Also, in an embodiment above, an operator is notified by displaying on a display panel information such as a low recognition rate or a stage in accordance with a component, but an operator may be notified of such information by a method such as sound or lights.

Also, in the above embodiments, the present disclosure is applied to components with leads, but the present disclosure may be applied to various types of components. Specifically, for example, the present disclosure may be applied to configuration components of solar panels, configuration components of power modules, electronic components without leads, and so on.

REFERENCE SIGNS LIST

32: loose component supply device (component supply device); 84: imaging device; 220: component support member (component support section); 226: stage; 332: suction nozzle (component holding tool); 452: individual control device (control device); 510: memory section; 512: acquisition section; 514: first reporting section; 516: calculating section; 518: second reporting section

What is claimed is:

1. A component supply device comprising:
   a component support section including multiple stages each configured to support multiple components in a scattered state, each of the multiple stages being removably attached to the component support section, the supporting surface of each of the multiple stages being a different shape;
a supply apparatus oscillating device configured to oscillate the stage such that the multiple components are moved and scattered;
an imaging device configured to image a component supported on the stage; and
a component holding tool configured to hold a selected component supported on the stage, based on the image data imaged by the imaging device.

2. The component supply device according to claim 1, wherein
the multiple stages have a supporting surface configured to support the components, the supporting surface of each of the multiple stages being a different color.

3. A component supply device comprising:
a component support section including multiple stages each configured to support multiple components in a scattered state, each of the multiple stages being removably attached to the component support section;
a supply apparatus oscillating device configured to oscillate the stage such that the multiple components are moved and scattered;
an imaging device configured to image a component supported on the stage;
a component holding tool configured to hold a selected component supported on the stage, based on the image data imaged by the imaging device; and
a control device, the control device including
a memory section configured to link a specific stage of the multiple stages and a component according to the specific stage;
an acquisition section configured to acquire component information that specifies the components scattered on the specific stage; and
a first reporting section configured to report the specific stage memorized in the memory device linked to the components specified by the component information acquired by the acquisition section.

4. A component supply device comprising:
a component support section including multiple stages each configured to support multiple components in a scattered state, each of the multiple stages being removably attached to the component support section;
a supply apparatus oscillating device configured to oscillate the stage such that the multiple components are moved and scattered;
an imaging device configured to image a component supported on the stage;
a component holding tool configured to hold a selected component supported on the stage, based on the image data imaged by the imaging device; and
a control section, the control section including
a calculating section configured to calculate a recognition rate that is a ratio of recognizable states of the components with respect to the components supported on a respective stage of the multiple stages based on the image data imaged by the imaging device, and
a second reporting section configured to report information indicating a low recognition rate when the recognition rate calculated by the calculating section is lower than a threshold.

5. A component supply device comprising:
a component support section including multiple stages each configured to support multiple components in a scattered state, each of the multiple stages being removably attached to the component support section;
an imaging device configured to image a component supported on the stage;
a component holding tool configured to hold a selected component supported on the stage, based on the image data imaged by the imaging device; and
a supply apparatus oscillating device configured to oscillate the stage such that the multiple components are moved and scattered, and configured not to oscillate the stage between imaging of the components by the imaging device and the component holding tool holding the selected component.

6. A component supply device comprising:
a component support section including multiple stages each configured to support multiple components in a scattered state, each of the multiple stages being removably attached to the component support section;
a supply apparatus oscillating device configured to oscillate the stage such that the multiple components are moved and scattered, the supply apparatus oscillating device including a cam member attached to the stage and a cam follower that follows the cam member, and movement of the cam follower along the cam member oscillates the stage;
an imaging device configured to image a component supported on the stage; and
a component holding tool configured to hold a selected component supported on the stage, based on the image data imaged by the imaging device.

7. The component supply device according to claim 3, wherein
the multiple stages have a supporting surface configured to support the components, the supporting surface of each of the multiple stages being a different color.

8. The component supply device according to claim 4, wherein
the multiple stages have a supporting surface configured to support the components, the supporting surface of each of the multiple stages being a different color.

9. The component supply device according to claim 5, wherein
the multiple stages have a supporting surface configured to support the components, the supporting surface of each of the multiple stages being a different color.

10. The component supply device according to claim 6, wherein
the multiple stages have a supporting surface configured to support the components, the supporting surface of each of the multiple stages being a different color.

* * * * *